United States Patent
Rachlin et al.

(10) Patent No.: US 8,472,737 B2
(45) Date of Patent: Jun. 25, 2013

(54) ATTITUDE ESTIMATION IN COMPRESSED DOMAIN

(75) Inventors: Yaron Rachlin, Brookline, MA (US);
Benjamin F. Lane, Grafton, MA (US);
Juha-Pekka J. Laine, Boston, MA (US);
Robin M. A. Dawson, Watertown, MA (US); Christopher C. Yu, Belmont, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 119 days.

(21) Appl. No.: 12/895,033

(22) Filed: Sep. 30, 2010

(65) Prior Publication Data

US 2012/0082345 A1 Apr. 5, 2012

(51) Int. Cl.
*G06K 9/46* (2006.01)

(52) U.S. Cl.
USPC .......................................................... 382/235

(58) Field of Classification Search
None
See application file for complete search history.

(56) References Cited

U.S. PATENT DOCUMENTS

| | | | |
|---|---|---|---|
| 3,488,504 A | | 1/1970 | Lowen |
| 3,781,114 A | * | 12/1973 | Marsh et al. ............. 356/139.02 |
| 4,621,329 A | * | 11/1986 | Jacob ............................. 701/513 |
| 4,679,753 A | | 7/1987 | Landecker |
| 4,746,976 A | * | 5/1988 | Kamel et al. ................. 348/116 |
| 4,755,874 A | | 7/1988 | Esrig et al. |
| 5,065,447 A | | 11/1991 | Barnsley et al. |
| 5,109,346 A | * | 4/1992 | Wertz ............................... 701/13 |
| 5,206,499 A | * | 4/1993 | Mantravadi et al. ....... 250/203.6 |
| 5,412,574 A | * | 5/1995 | Bender et al. ................. 701/513 |
| 5,546,309 A | | 8/1996 | Johnson et al. |
| 5,745,869 A | | 4/1998 | van Bezooijen |
| 5,810,297 A | | 9/1998 | Basuthakur et al. |
| 5,935,195 A | | 8/1999 | Quine |
| 6,012,000 A | * | 1/2000 | Holmes et al. ................... 701/13 |
| 6,111,780 A | * | 8/2000 | Bertin ............................ 365/154 |
| 6,131,058 A | | 10/2000 | Boeinghoff et al. |
| 6,236,939 B1 | | 5/2001 | Wu et al. |
| 6,252,627 B1 | | 6/2001 | Frame et al. |
| 6,266,616 B1 | * | 7/2001 | Needelman ................... 701/513 |
| 6,285,927 B1 | | 9/2001 | Li et al. |
| 6,433,710 B1 | | 8/2002 | Heavens et al. |
| 6,523,786 B2 | * | 2/2003 | Yoshikawa et al. ........... 244/171 |
| 6,766,056 B1 | | 7/2004 | Huang et al. |
| 7,113,210 B2 | | 9/2006 | Bloom |
| 7,216,036 B2 | | 5/2007 | Brady et al. |
| 7,245,758 B2 | | 7/2007 | Blackwood et al. |
| 7,388,599 B2 | | 6/2008 | Maddison et al. |
| 7,447,591 B2 | | 11/2008 | Belenkii et al. |
| 8,130,837 B2 | | 3/2012 | Heyward |
| 8,331,726 B2 | | 12/2012 | Stellari et al. |

(Continued)

OTHER PUBLICATIONS

J.W. Percival et al., "The ST5000: a high-precision star tracker and attitude determination system", Proc. SPIE 7010, 70104H (2008).*
J. A. Tappe, "Development of Star Tracker System for Accurate Estimation of Spacecraft Attitude", MS Thesis, Naval Postgraduate School, Dec. 2009.*

(Continued)

*Primary Examiner* — Wenpeng Chen
*Assistant Examiner* — Feng Niu
(74) *Attorney, Agent, or Firm* — Goodwin Procter LLP

(57) ABSTRACT

In general, in one embodiment, a starfield image as seen by an object is analyzed. Compressive samples are taken of the starfield image and, in the compressed domain, processed to remove noise. Stars in the starfield image are identified and used to determine an attitude of the object.

21 Claims, 10 Drawing Sheets

U.S. PATENT DOCUMENTS

| | | | |
|---|---|---|---|
| 2003/0044077 A1* | 3/2003 | Okada | 382/239 |
| 2003/0174900 A1 | 9/2003 | Puetter et al. | |
| 2003/0198392 A1 | 10/2003 | Jiang et al. | |
| 2004/0098178 A1 | 5/2004 | Brady et al. | |
| 2004/0184674 A1 | 9/2004 | Lim et al. | |
| 2004/0210617 A1 | 10/2004 | Vetterli et al. | |
| 2005/0069210 A1 | 3/2005 | Tardif | |
| 2005/0225648 A1 | 10/2005 | Lin et al. | |
| 2006/0029377 A1 | 2/2006 | Stavely et al. | |
| 2006/0140494 A1* | 6/2006 | Ishikawa | 382/239 |
| 2006/0235614 A1 | 10/2006 | Jacox et al. | |
| 2006/0239336 A1 | 10/2006 | Baraniuk et al. | |
| 2006/0245640 A1 | 11/2006 | Szczuka | |
| 2007/0036442 A1 | 2/2007 | Stoffer et al. | |
| 2007/0038374 A1* | 2/2007 | Belenkii et al. | 701/222 |
| 2007/0217517 A1 | 9/2007 | Heyward | |
| 2008/0056538 A1* | 3/2008 | Frank | 382/113 |
| 2008/0095400 A1 | 4/2008 | Nagano et al. | |
| 2008/0114546 A1 | 5/2008 | Kamel et al. | |
| 2008/0118154 A1* | 5/2008 | Kurth et al. | 382/190 |
| 2008/0136947 A1 | 6/2008 | Baer | |
| 2008/0175456 A1* | 7/2008 | Ioannou | 382/131 |
| 2009/0175530 A1 | 7/2009 | Sjostrom et al. | |
| 2010/0228481 A1* | 9/2010 | Kamel et al. | 701/226 |
| 2010/0329586 A1 | 12/2010 | Stellari et al. | |
| 2012/0275690 A1* | 11/2012 | Melvin et al. | 382/156 |

OTHER PUBLICATIONS

Liebe "Star Trackers for Attitude Determination" IEEE AES Systems Magazine, Jun. 1995, pp. 10-16.

Quine "Determining Star-Image Location: A New Sub-Pixel Interpolation Technique to Process Image Centroids," Computer Physics Communications, 177, Jun. 2007, pp. 700-706.

Scholl "Six-Feature Star-Pattern Identification Algorithm," Applied Optics, vol. 33, No. 20, Jul. 10, 1994, pp. 4459-4464.

Carlsohn et al "Real-time compression and retrieval of astronomical images" Proceedings of the International Conference on Systems, Man and Cybernetics. Le Touquet, pp. 20-25 Oct. 17, 1993.

Jorgensen et al. "Star tracker and vision systems performance in a high radiation environment" Aerospace Conference vol. 2, pp. 95-103, Mar. 6, 1999.

Le Pera et al. "Track 7: Spacecraft Avionics Systems & Technologies ED" IEEE, pp. 61-70, Mar. 1, 2007.

Percival et al. "Low-cost attitude determination system and imager with embedded compression" Proceedings of SPIE, vol. 4013, pp. 394-400, Jan. 1, 2000.

White et al. "Compression and progressive transmission of astronomical images" Internet Citation: http://www.ee.unlv.edu~regent/SPACE/h-compress.pdf pp. 1-11, Mar. 16, 1994.

International Search Report and Written Opinion for PCT/US2011/053986, 19 pages, mailed: Mar. 27, 2012.

Candés et al. "An Introduction to Compressive Sampling" IEEE Signal Processing Magazine, 25(2) pp. 21-30, Mar. 2008.

* cited by examiner

ATTITUDE ESTIMATION IN COMPRESSED DOMAIN

TECHNICAL FIELD

Embodiments of the invention generally relate to attitude estimation and, in particular, determining the attitude of an object based on the object's view of a starfield.

BACKGROUND

A spacecraft, aircraft, ground-based platform, or other object may have an unknown orientation (also known as attitude, i.e., angle of rotation in one or more dimensions relative to a reference). One way to determine the orientation of the object is to acquire one or more images of a starfield seen by the object, analyze the images, and compare the results to known starfield data (stored in, e.g., an on-board or remote database). By identifying known stars and noting their positions in the starfield relative to the object, the orientation of the object may be derived.

Current star-tracking systems and methods acquire a large number of images of the starfield (from, e.g., a digital camera on board the object) and store the images in computer memory. The images are averaged, either as they are acquired or after acquisition of all the images, to improve their quality (by, e.g., removing noise). These prior-art systems and methods require a large amount of memory to store the images and a large amount of processing power to average or otherwise process the images.

A star-tracking system may be exposed to high amounts of ionizing radiation, however, and the circuits and memory therein must be specially hardened to protect against computational and memory errors caused by, e.g., particle radiation and/or electromagnetic radiation. Large radiation-hardened ("rad-hard") memory and circuits may be prohibitively expensive and, when used in a star-tracking system, may limit the size of the starfield image stored and/or the speed and amount of image processing possible. This limit may affect the accuracy achievable with the star-tracking system. Furthermore, some systems may have severe power constraints, and the processing required to analyze the images may consume an unacceptable amount of power.

A need therefore exists for a star-tracking system that is capable of increased accuracy of measurement and that uses available rad-hard memory and processing power more efficiently while consuming less power.

SUMMARY

In general, various aspects of the systems and methods described herein use compressive sampling (also known as compressive imaging) to determine the attitude of an object by capturing and processing starfield image data as it is seen by the object. Compressive sensing is a signal-acquisition technique that combines sampling and compression into a single step, unlike prior-art techniques that first sample an image and then compress it. Data in compressed space may be more efficiently processed, e.g., to remove noise, and the attitude of the object may be derived using only compressed data. An attitude-estimation system using compressive sampling requires less memory, less input/output bandwidth, and less power while using a smaller image sensor and requiring less shielding from the environment.

In general, in one aspect, a method for estimating an attitude of an object includes determining, in a compressed domain, the positions of a plurality of stars in a compressed sample representing a starfield view as seen from the object. Each of the plurality of stars is identified, in the compressed domain, based at least in part on their determined positions. An attitude of the object is estimated, again in the compressed domain, based at least in part on the identified stars.

In various embodiments, the estimated attitude is stored in computer memory, which may be rad-hard computer memory. The identifying step may include looking up a shape of a triangle formed by three stars in a database and/or applying a star-identification algorithm. The estimating step may include applying, in the compressed domain, a downhill least-squares-fit and/or a minimization algorithm to the compressed sample and identified stars. The compressed sample may include an average of a plurality of compressed samples of the starfield view, and the starfield view may include a plurality of digital images.

The object may be a satellite, a spacecraft, an aircraft, or a ground-based star-viewing object. The accuracy of the determined position of a star may be increased based on the identified stars, and the identified stars may be updated based upon the increased accuracy in the determined position of the star.

In general, in another aspect, a computer system estimates an attitude of an object. A search module determines, in a compressed domain, the positions of a plurality of stars in a compressed sample representing a starfield view as seen from the object. An identification module identifies, in the compressed domain, each of the plurality of stars based at least in part on their determined positions. An estimation module estimates, in the compressed domain, an attitude of the object based at least in part on the identified stars.

The estimated attitude may be stored in computer memory, which may be rad-hard computer memory. The identification module, in identifying each of the plurality of stars, may look up a shape of a triangle formed by three stars in a database. The estimation module, in estimating the attitude of the object, may apply a downhill least-squares-fit algorithm and/ or a minimization algorithm to the compressed sample and identified stars. The compressed sample may include an average of a plurality of compressed samples of the starfield view, and the starfield view may include a plurality of digital images.

An update module may increase the accuracy of the determined position of a star by using information about the identified stars, and may update the identified stars based upon the increased accuracy in the determined position of the star. The object may be a satellite, a spacecraft, an aircraft, or a ground-based star-viewing object.

In general, in yet another aspect, a method for estimating an attitude of an object includes receiving a first compressed sample representing an image of a starfield. A second compressed sample representing one of a plurality of known views of the starfield is determined. An error is computed between the first compressed sample and the second compressed sample, and a new view of the starfield is selected from the plurality of known views that reduces the error.

BRIEF DESCRIPTION OF THE DRAWINGS

The foregoing and other objects, aspects, features, and advantages of the invention will become more apparent and may be better understood by referring to the following description, taken in conjunction with the accompanying drawings, in which.

DETAILED DESCRIPTION

Compressive sampling is a technique for efficiently sensing and sampling, in a single step, input data having certain known properties. Sampling an unknown data set, using classical sampling theory, typically requires that samples are collected uniformly in time with a sampling rate at least twice as high as the highest frequency in the signal (i.e., the Nyquist frequency). For some kinds of input data, however, this level of sampling is not required and unnecessarily wastes system resources. If certain properties of the input data may be assumed, alternative sampling techniques, such as compressive sampling, may be used.

An input data stream or signal is "sparse" (and thus suitable for compressive sampling) if it can be accurately approximated using very few vectors in a properly chosen basis. A starfield image, for example, consists of a relatively few points of light surrounded by large areas of emptiness. This type of input data is highly structured and easily compressible. Describing a starfield image using a particular basis set renders it possible to store and recover positions of the stars therein with high accuracy while capturing only a limited number of measurements, as explained in greater detail below. For a properly chosen basis of linear measurements, the number of compressive sensing measurements required to acquire the signal scales linearly with the number of large coefficients (e.g., stars) in the approximation basis, but only logarithmically with the dimension of the signal (e.g., roughly proportional to the number of stars times the logarithm of the number of pixels). For a megapixel imager having $10^6$ pixels, the number of measurements required is thus approximately several tens of thousands.

Figure 1:
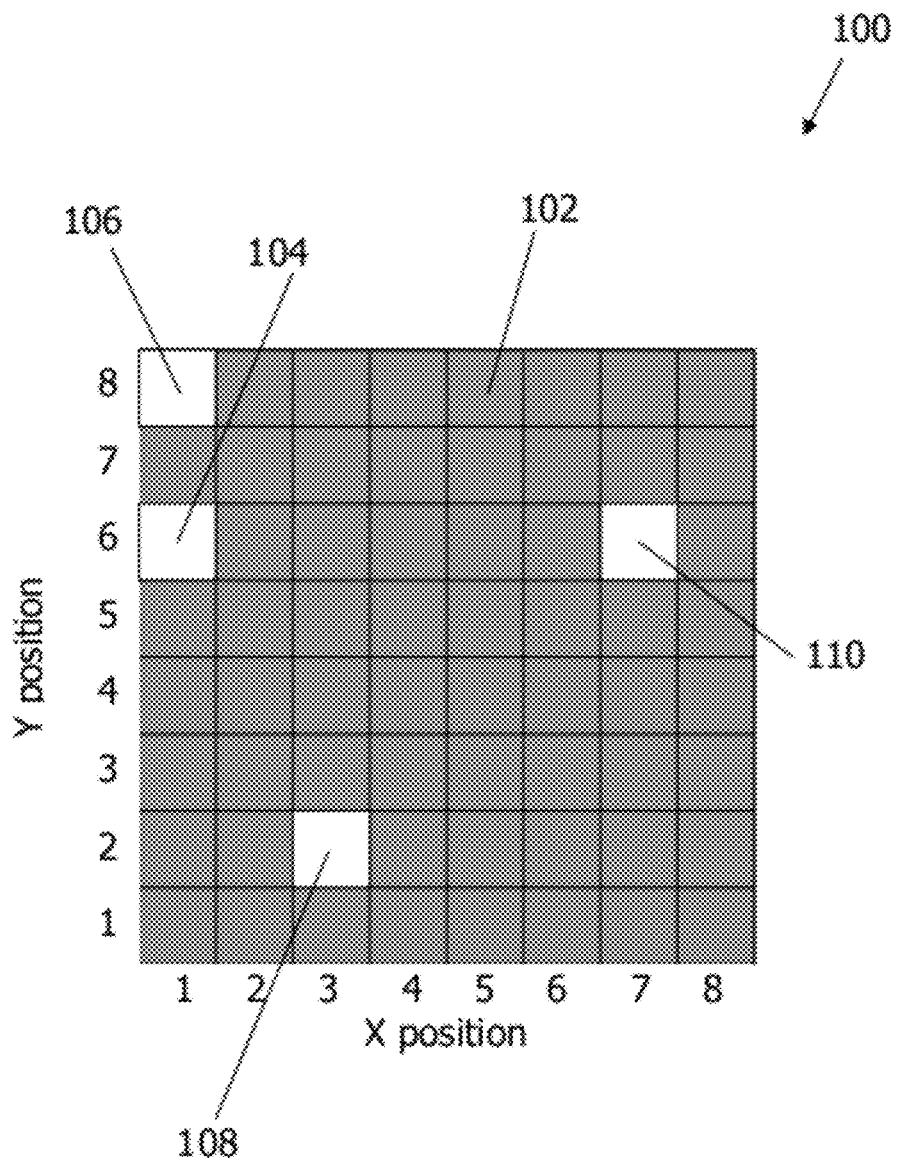
FIG. 1 is an illustration of a digitized starfield image in accordance with an embodiment of the invention.

FIG. 1 illustrates a simplified model of a digitized starfield image 100. The image 100 consists mostly of empty space 102, but also includes light points (i.e., stars) 104, 106, 108, 110 at (x,y) positions (1,6), (1,8), (3,2) and (7,6). A digital starfield image in a real application may contain millions of pixels, and more than one pixel may be used to represent an image of a star. A traditional sampling technique may sample the image 100 and store the entire image 100 in computer memory for later processing. This traditional technique is wasteful in terms of both storage space and processing resources at least because it stores and processes large amounts of empty space 102. As described above, computer memory and processing power are especially expensive in spacecraft and other craft for use in extreme conditions at least because electronic circuits therein must be shielded against radiation common under those conditions and because of the additional power consumed thereby.

Using compressive sampling techniques, the starfield image 100 may be captured and sampled much more efficiently by taking advantage of the scarcity of the image 100. One or more linear samples may be selected and applied to the image, thereby forming a basis set for compressively sampling the image. Only the results of these linear samples are stored in computer memory and processed, thereby vastly reducing the storage space and processing power required. In addition, as described in greater detail below, many processing steps may be performed in compressed space (i.e., using only the compressively sampled data), providing further savings in processing resources, processing time, and power consumption.

Examples of compressive samples suitable for sampling a starfield image include determining the number of light pixels in the even-numbered (or other multiple of) pixels, rows, and/or columns of the image; the number of light pixels in the odd-numbered (or other multiple of) pixels, rows, and/or columns; the number of light pixels in each half, third, fourth, or other division of the image; the number of light pixels in a (reproducibly) random selection of the pixels in the image; and/or counting light pixels using any other linear samples. The sum of the light pixels captured by each measurement is placed into a separate sum Given enough samples and sums produced thereby, the image may be wholly or partially reconstructed using only the sums (i.e., the compressively sampled data).

For example, referring again to the starfield image 100, the basis of linear samples used may be: (a) the total number of stars; (b) stars in even rows; (c) stars in even columns; (d) stars in every third column (e.g., columns evenly divisible by 3); (e) stars in the top half of the image 100; (f) stars in the right half of the image 100; and (g) stars in the bottom diagonal half of the image 100 (i.e., locations where x/y>1). The values of these samples for the image 100 are: (a) 4; (b) 4; (c) 0; (d) 1; (e) 3; (f) 1; and (g) 2. Given just these values, the positions of the stars 104, 106, 108, 110 may be deduced. For example, given that there are three stars on the top half of the image 100, one star on the right half, and two stars below the x=y diagonal, it can be deduced that two stars lie in the upper-left quadrant and one star lies in each of the upper-right and lower-left quadrants. Furthermore, because zero stars lie in odd rows or in even columns, the star in the lower-left quadrant must lie at (3,2) and the star in the upper-right quadrant must lie at (7,6). Finally, because only one star lies in a column divisible by three, the two stars in the upper-right quadrant must lie at (1,6) and (1,8). Note that, however, many or all of the image-processing algorithms described herein may be performed on the compressed data (i.e., values a-g) without re-deriving the locations of the stars 104, 106, 108, 110 from the data (i.e., without de-compressing the image). Furthermore, the current invention is not limited to these types of samples, and any types of compressive samples may be used.

In more complicated examples involving much larger numbers of pixels, the savings gained by compressively sampling a starfield image become even greater. Compressively sampling an image produced by typically sized image sensors may reduce the memory required to store the image by a factor of 30 or more. In addition, compressive sampling significantly reduces the number of image samples that must be acquired, stored, and processed during the stellar sighting—approximately K log N (where K is the number of large coefficients, e.g., stars) measurements compared to N measurements required in traditional approaches, as explained in greater detail with reference to FIG. 4.

In some embodiments, the basis of linear samples used to compressively sample an image may not precisely identify the location of the stars within the image. A smaller number of samples may identify the location of stars within an acceptable margin of error, for example, and lead to even greater savings in storage and processing requirements. Combinations of different algorithms may be tried and the most efficient set for a given application may be identified and used.

In the above example, the compressive samplings reduced the information stored for each image to seven integers (a)-(g), which would likely occupy a much smaller space in memory than the image compressed with a typical image compression algorithm (e.g., GIF, JPEG, or PNG compression), but is comparable in size to simply storing the (x,y) coordinates for each star (i.e., eight integers). As explained below in greater detail, however, storing the image data as compressed samples leads to computational efficiencies in post-processing the image that are unavailable when the image is stored using a typical compression algorithm or as (x,y) data. In addition, as also explained below, the intensity of each star may be much more easily stored and processed in compressed space than in raw (x,y) space.

Attitude Estimation with Compressive Sampling of Starfield Data

Figure 2:
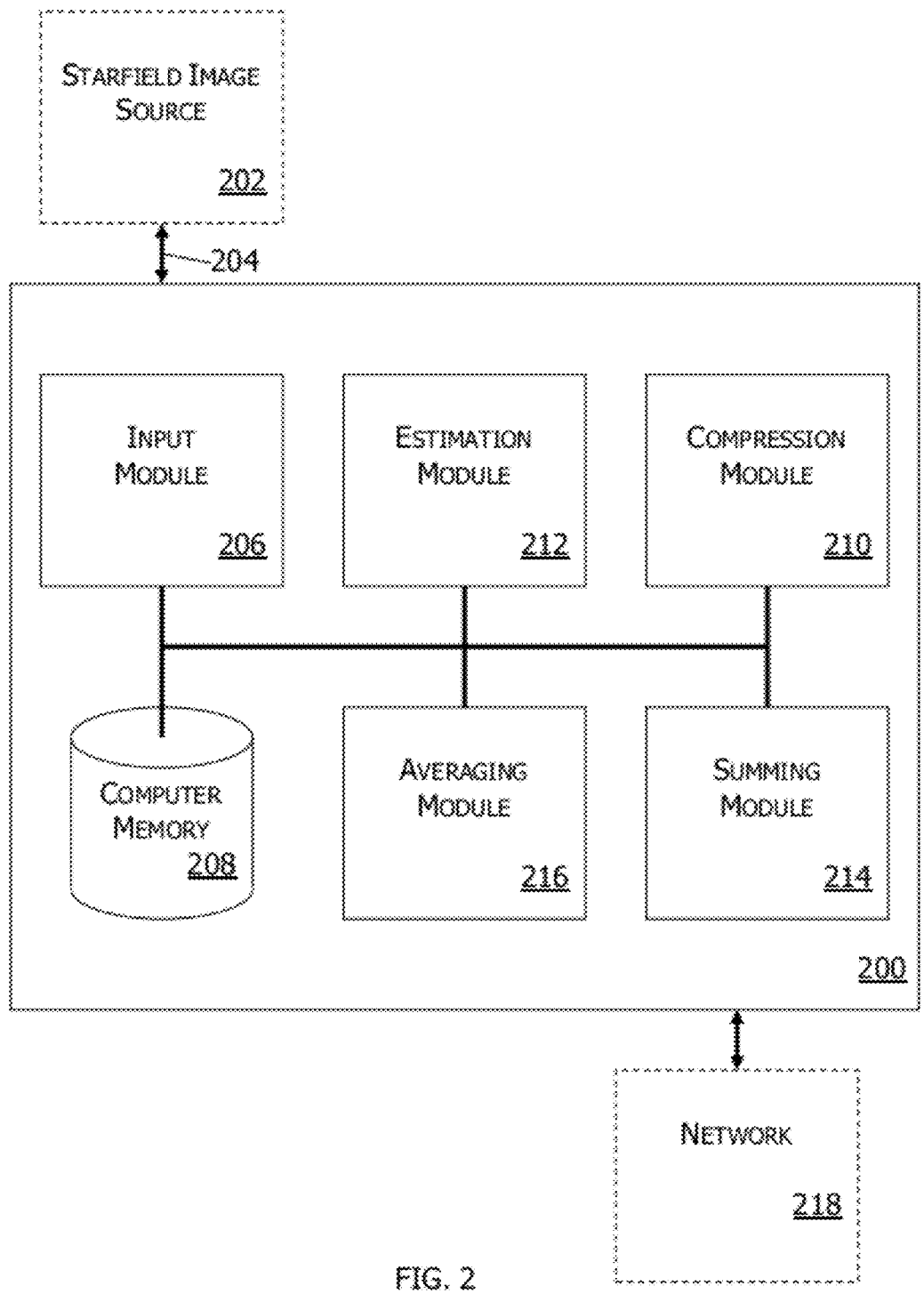
FIG. 2 is a block diagram of a system for estimating the attitude of an object in accordance with an embodiment of the invention.

FIG. 2 illustrates a computing system 200 for estimating the attitude of an object based on a digital starfield image that represents a view of a starfield as seen by the object. A starfield image source 202 provides the starfield image to the computing system 200 over a network link 204. The image source 202 may be a digital camera, camcorder, video camera, or any other device having a sensor for capturing a real-world image as digital data. The network link may be a direct, wired connection to the computing system 200, a wireless connection, or a connection using a network-based protocol (such as TCP/IP). The image source 202 may be disposed proximate the computing system 200 or may be located remotely to the computing system 200. In one embodiment, the computing system 200 is disposed on or in an object, and the image source 202 provides the view of the starfield as seen by the object.

An input module 206 receives data over the link 204 from the image source 202. The received image data may be stored in a local buffer in the input module 206 or in computer memory 208. The computer memory 208 may be conventional computer memory or radiation-hardened ("rad-hard") computer memory. As explained above, a compression module 210 compressively samples the received image data using one or more linear compression samples and stores the results in computer memory 208. An estimation module 212 estimates the attitude of the object based at least in part on the compressed sample, as explained further below. A summing module 214 may update a compressed-sample running sum with new compressed sample data, and an averaging module 216 may average the compressed-sample running sum (with respect to the number of compressed samples taken) to improve the sample's signal-to-noise ratio. The computing system 200 may transmit intermediate or final results of the compressive sampling and/or estimated attitude over a network 218. The implementation of the system 200 depicted in FIG. 2 is not intended to be limiting, and the functionality described herein may be implemented by combining or separating the modules 206-216 into different configurations, as understood by one of skill in the art. For example, the summing 214 and averaging 216 modules may be combined into a single module, as may the input 206 and compression 210 modules.

Figure 3:
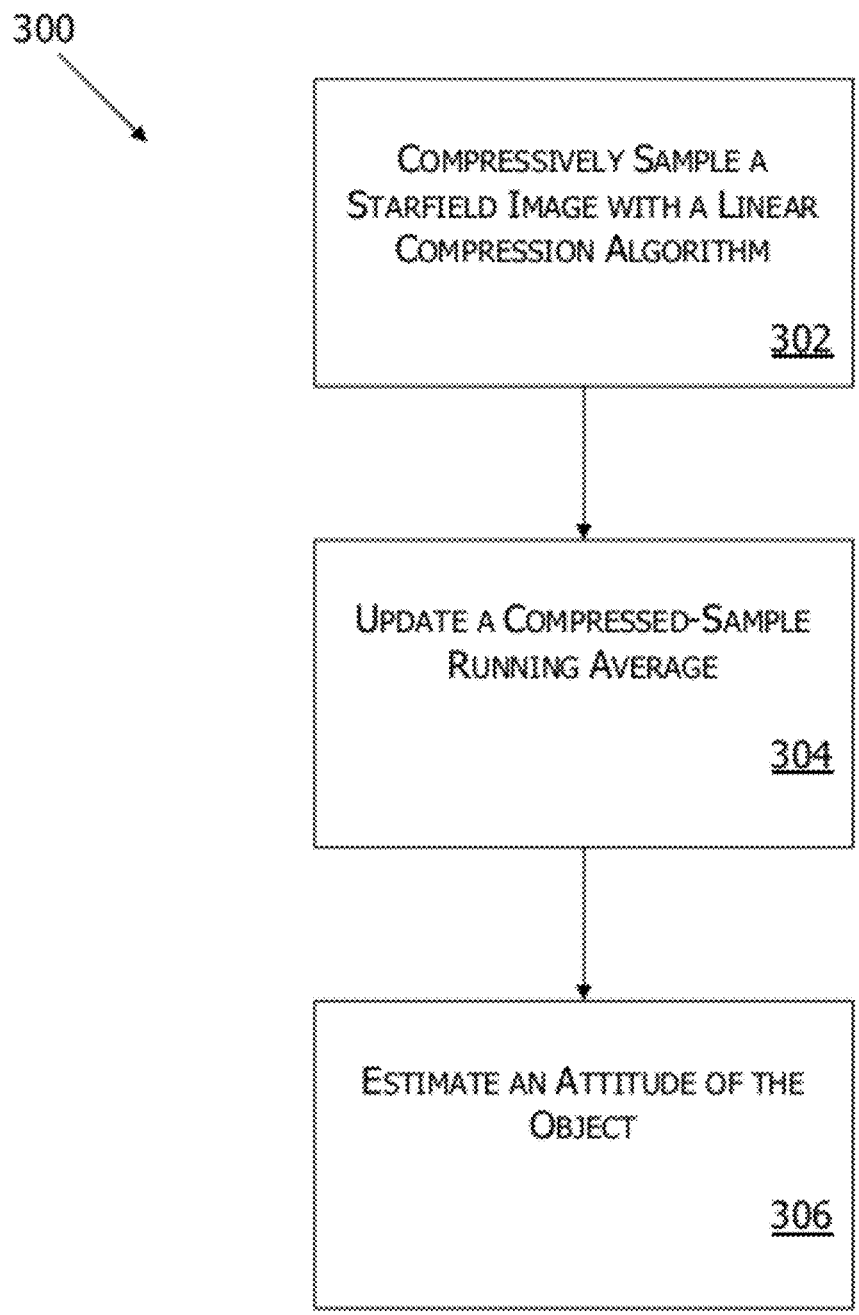
FIG. 3 is a flowchart for estimating an object's attitude based on a digital starfield image in accordance with an embodiment of the invention.

FIG. 3 illustrates a flowchart for estimating an object's attitude based on a digital starfield image. In summary, a starfield image is compressively sampled with a linear compression sample (Step 302). The compressed sample may be used to update a compressed-sample running average (Step 304). Using the compressed sample, the attitude of an object viewing the starfield image is estimated (Step 306).

Referring again to Step 302, in greater detail, the input module 206 acquires image data from an image source 202. The input module 206 may control when the image source 202 sends new image data, the size and quality of the received image (e.g., number of pixels per image) received, and/or the image capture parameters (e.g., shutter speed, focal length, zoom, and/or f-stop number) of the image source 202.

In one embodiment, the image data is conventionally acquired and then compressively sampled. In another embodiment, the image source 202 compressively samples the image data as it is acquired, and the input module 206 receives already-compressed data. In this embodiment, the image source may be specially designed to acquire the image directly using the compressive samples. Acquiring the image using compressive sampling in analog, for example, and then doing an A/D conversion on these measurements, may significantly reduce the power required for image acquisition and sampling.

In one embodiment, the input module 206 changes the image parameters based on feedback from previously received images—for example, if the computing system 200 is having difficulty analyzing a series of images (as explained further below), the input module 206 may request that the image source 202 increase the quality of the received images. On the other hand, if a contiguous series of received images are successfully analyzed, the input module 206 may request that the image source 202 send images of lesser quality to thereby reduce network traffic and processing time (and, as a result, power consumption). In general, the computing system 200 may acquire additional compressive samples adaptively as needed.

The compression module 210 receives the input image data and compressively samples it using one or more of the linear samples described above or any other compressive sampling algorithm known in the art. In one embodiment, the compression module 210 samples the image data using a threshold value, producing a 1 (for example) if an analyzed pixel is above a certain level of brightness and a 0 if the pixel is below this value. In another embodiment, the intensity of the light captured in the pixel is represented by a numeric value (e.g., an integer between 0 and 255), and the compression module 210 adds the intensity value in the compressive-sample calculation. Given, for example, two pixels of intensity 140 and 150 in an even row, a compressive-sample algorithm that sums pixels in even rows may output 2 (if the sample counts pixels having an intensity greater than, say, 127) or may output 290 (if the sample sums intensity values of each pixel).

In one embodiment, the compression module 210 processes only one image, and the results produced are used to estimate the attitude of the object. In another embodiment, referring to Step 304, more than one image is captured and processed, and the results are averaged together. Averaging a plurality of images may aid in eliminating noise from the final result. For example, regions of a captured image may appear like stars but may correspond to other objects, such as airplanes or satellites. Other sources of noise include radiation, electrical interference, or failures in the circuits of the image source 202 or system 200. By sampling several images taken over a period of time, transitory noise sources may be filtered out of the final result. A single image may have a very low signal-to-noise ratio, but averaging many such frames together may produce a high signal-to-noise ratio.

In one embodiment, a summing module 214 adds the result of sampling each image to running totals—one for each compressive sample. Because only linear samples are used for compressive sampling, the results of each sample may be simply added to previous samples. For example, if one of the samples is the sum of light pixels in even rows of the image, this sum may be added to the number of light pixels in even rows found in all previously sampled images. In one embodiment, the number of samples is tracked and, when a sufficient number of samples has been collected, the running total for each sample is divided by the number of samples taken, thereby producing an average number for each sample. In another embodiment, the raw sum data is used to identify the location of any stars in the image; in this embodiment, the relative size of each running total is compared. In yet another embodiment, the averaging module 216 computes a running average of the compressed samples (i.e., the average of the compressed samples is re-computed upon receipt of each new compressed sample).

Figure 4:
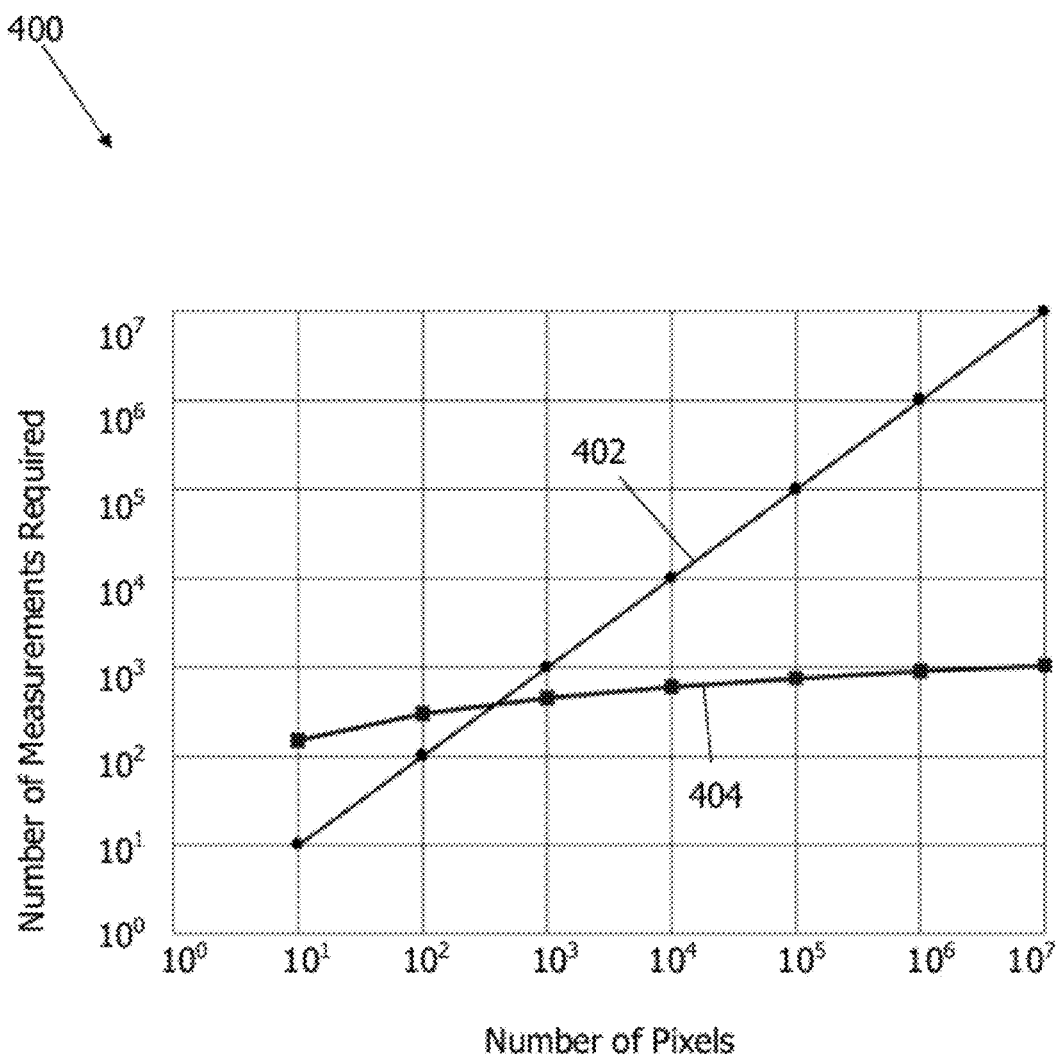
FIG. 4 is a chart comparing compressive sampling to traditional sampling in accordance with an embodiment of the invention.

In a prior-art averaging system, processing an image having 300 stars may require $10^6$ storage locations and additions because each image must be stored and processed in its entirety. Using the compressive sampling approach of the present invention, the same operation may be performed using approximately 3000 memory locations and additions. FIG. 4 is a chart 400 illustrating the how the number of measurements required in a traditional sampling implementation 402 increases much faster than the number of measurements required in a compressive-sampling implementation 404, in accordance with embodiments of the current invention, as the number of pixels in the image increases. The linear increase in required measurements of the traditional approach 402 is caused at least by the necessity of examining and processing each pixel in each image; as the number of pixels increases, the processing requirement increases linearly with it. The compressive-sampling approach 404, on the other hand, processes a constant number of linear samples regardless of the size of the incoming images, and thus has nearly constant processing requirements with respect to image size.

In one embodiment, collection of compressed samples continues until a specified number of samples has been taken. The specified number may be defined to guarantee a minimum level of accuracy, and may be changed to reflect operating conditions of a particular system 200. For example, a system 200 that must view stars through a planetary atmosphere may require more samples than a space-borne system 200 to achieve the same level of accuracy. In another embodiment, the compression module 210 dynamically determines the number of samples based on analyzing sampled data. For example, sampling may continue until a statistically significant differentiation is seen in the results of any linear samples employed. The compression module 210 may halt sampling once a maximum number of samples has been taken or once a maximum amount of time has elapsed.

In one embodiment, the compression module 210 samples every pixel in the starfield image. In another embodiment, the compression module 210 samples a subset of the pixels. The subset may be statically determined, and may be, for example, only even or odds pixels, a checkerboard pattern of pixels, only odd or even rows of pixels, or any other subset. In another embodiment, pixels in regions of the image having low sampled values (i.e., regions not likely to contain stars) are dynamically determined and eliminated from sampling.

Once the view of the starfield has been captured and any noise in the signal has been removed or reduced to a degree such that signals in the noise may be distinguished therefrom, the attitude of the object may be estimated (Step 306). The output of the compression module 210, summing module 214, and/or averaging module 216 is analyzed to determine the positions of any stars in the starfield image. In one embodiment, this analysis is performed in compressed space. For example, the results of each linear sample used in the compressive sampling may be analyzed and the positions of stars deduced therefrom. In one embodiment, only stars passing a given threshold of intensity or brightness are analyzed, and stars deemed too dim are discarded. Once the position of one or more stars in the starfield is determined, the stars are identified and the attitude of the object is derived therefrom, as explained in greater detail below.

Attitude Estimation by Reducing Noise with Dragback

Dragback is a noise-reduction operation similar to averaging. In one embodiment, an image source moves its view of a starfield in a known direction and for a known distance. Any signals (e.g., stars) in the starfield image will move with respect to the view of the starfield, while some noise in the image will not move with respect to the starfield. By noting which objects move and which do not, the non-moving objects can be accounted for and removed from the image.

Figure 5:
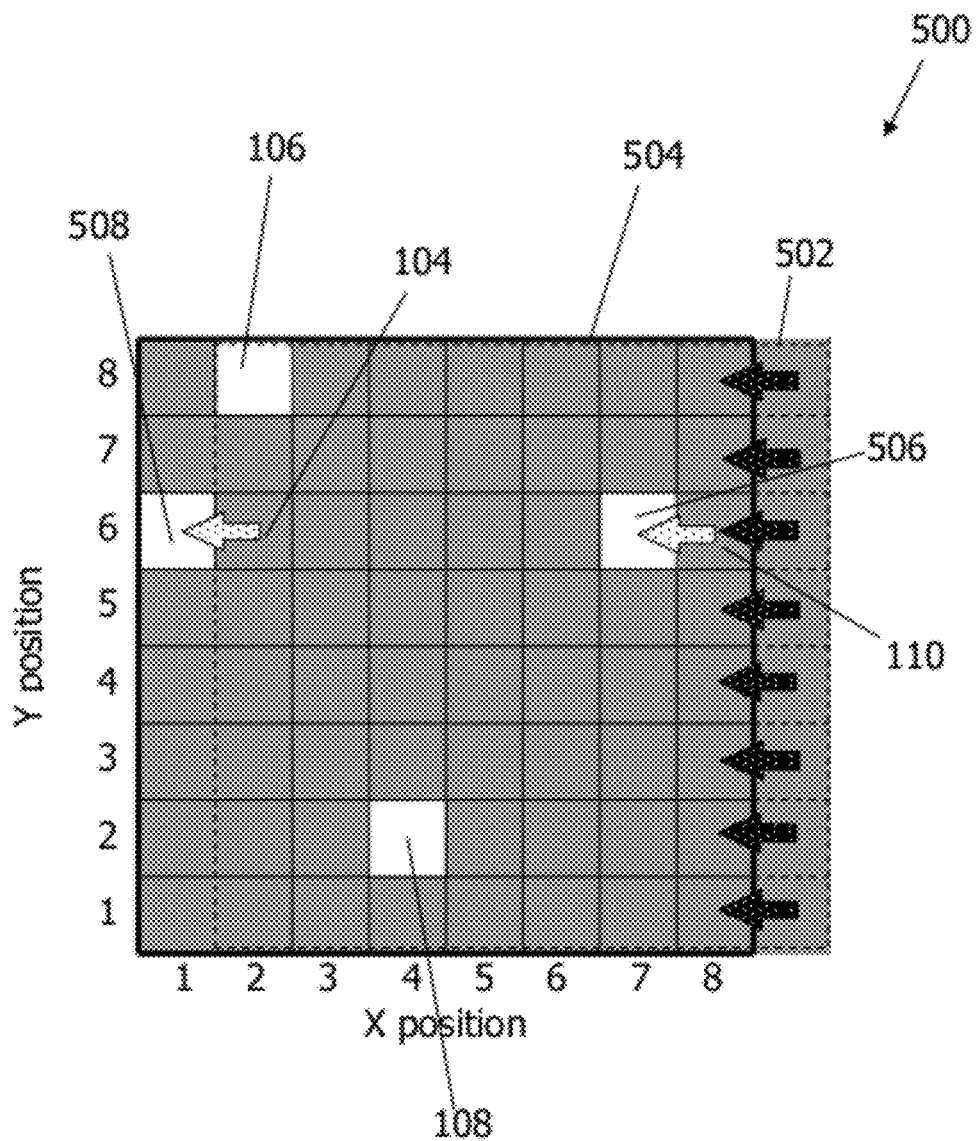
FIG. 5 is an illustration of a dragback procedure in accordance with an embodiment of the invention.

FIG. 5 illustrates operation of a dragback procedure 500 using the example starfield image presented in FIG. 1. In FIG. 5, the view of the starfield image has been shifted to the left one pixel, from the old view 502 to a new view 504. As the view changes, light pixels 104 and 110 also shifted to the left one pixel to new positions 508 and 506, respectively. Light pixels 106 and 108, however, did not move with the new view 504, and remain in the same place with respect to the old view 502.

From these results, it may be deduced that light pixels 506, 508 do not correspond to stars and are produced by noise local to a camera or other device capturing the starfield image. A star does not move as a camera lens moves, but instead remains fixed in place regardless of the orientation of a camera capturing its image. Because the light pixels 506, 508 moved with the camera view, they are likely the result of a noise source produced by the camera itself. Examples of such noise sources include flaws in or debris on the camera lens, a stuck or otherwise faulty pixel in a photosensor within the camera, and a hardware failure in the camera's internal circuitry. In general, dragback may filter dark noise, fixed-pattern noise, or other types of noise.

Figure 6:
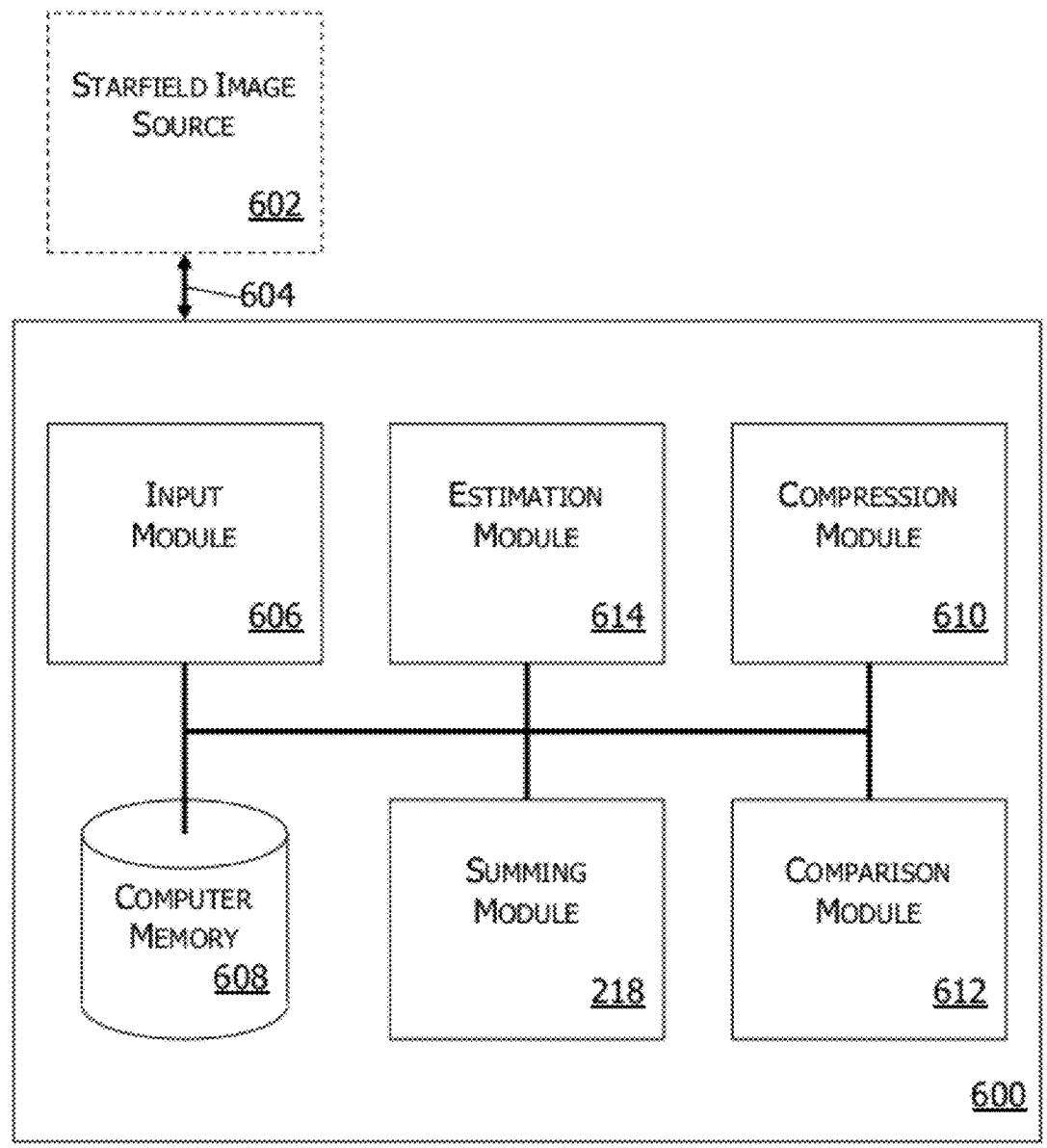
FIG. 6 is a block diagram of a system for performing the dragback procedure in accordance with an embodiment of the invention.

FIG. 6 illustrates a system 600 for performing the dragback algorithm in compressed space using the compressed samples described above. A starfield image source 602 provides an image to the system 600 over a network link 604 to an input module 606, which may have any and all of the features described for the input module 206 of FIG. 2. Some or all of the input image may be stored in computer memory 608, which may be rad-hard computer memory. A compression module 610 receives a first image from the input module 606 and compressively samples it, using techniques described above. The input module 606 instructs the starfield image source 602 to alter its view of the starfield by a known amount and receives a second image representing the second view. In one embodiment, the image source 602 may be programmed or configured to automatically change the view at periodic intervals.

The compression module 610 compressively samples the second view, taking into account the alteration of the starfield image. For example, the compression module 610 may employ a linear sample that sums stars appearing in odd columns of the starfield image. When the compression module 610 samples the second image, it takes into account the known alteration in the view of the starfield image and adjusts the compressive samples accordingly.

Figure 7:
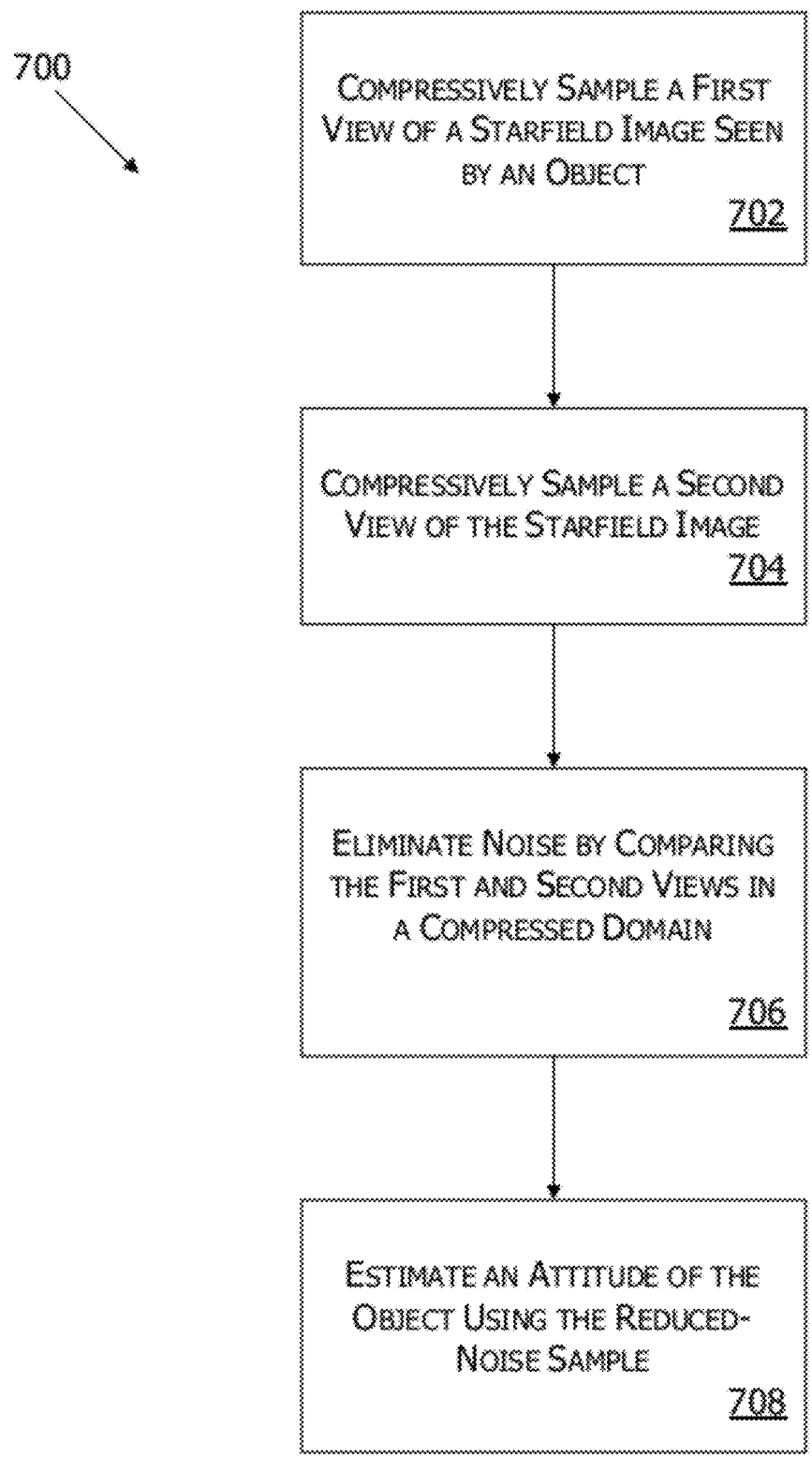
FIG. 7 is a flowchart for estimating an object's attitude using the dragback procedure in accordance with an embodiment of the invention.

FIG. 7 illustrates a flowchart 700 for estimating an object's attitude using the above-described dragback technique. Starfield image data, representing a first view of a starfield as seen from an object, is compressively sampled to create a first compressed sample (Step 702) and a second view is compressively sampled to create a second compressed sample (Step 704). In other embodiments, further compressed samples may be created from additional views. Noise common to the first and second views is eliminated by comparing, in a compressed domain, the first and second compressed samples to create an improved quality sample (Step 706). The improved-quality sample is employed to estimate an attitude of the object (Step 708).

As an illustrative example, referring to Steps 702 and 704, the first image may be the starfield image 100 of FIG. 1 and the second image may be the left-shifted starfield image of FIG. 2. A linear sample that counts stars appearing in odd columns counts all four stars 104, 106, 108, 110 appearing in the first image 100. The same linear sample, applied to the shifted image 500, adjusts each column number by one to account for the one-pixel left shift of the image. Thus, the linear sample counts two stars 106, 108 as appearing in odd-numbered columns, but not the two shifted stars 506, 508. As this example shows, the stars 506, 508 that shifted left with the left-shift of the starfield view are removed from one compressive-sample output bucket and are placed in a different bucket.

Referring to Step 706, a comparison module 612 compares the results from the compressive samples of the first and second starfield views to eliminate or reduce the emphasis on the shifted stars 506, 508. In one embodiment, the comparison module adds the results of the first and second compressive samples together. Because the samples corresponding to the shifted stars 506, 508 are spread out across different buckets, their contributions will be less to a single bucket than stars 106, 108 that did not shift. Thus, the effects of stars 106, 108 will outweigh the effects of noise 506, 508, as reflected in the final compressive-sample sums, and in Step 708 an estimation module 614 may eliminate the noise as it estimates the attitude of the object, as explained in greater detail below.

A summing module 618 may average multiple images received from each of the first and second views. The averaging may detect and remove types of noise, such as a flashing light source, that may not be detected and removed by the comparison module 612. In one embodiment, the input module 606 receives images from the image source 602 corresponding to three or more views of the starfield image. The views may differ in direction of movement and/or amount of movement. The image source may return to an earlier view at a later point in time for another measurement.

In one embodiment, instead of adding and subtracting values to row and column indices, the compression module 610 compressively samples each view with no alteration to the linear samples. The comparison module 612 analyzes each compressed sample for patterns appearing therein and sums together the parts of the different images that are the same. This approach may be used when the image source 602 is not capable of precise movement or control.

Attitude Estimation in Compressed Domain

Figure 8:
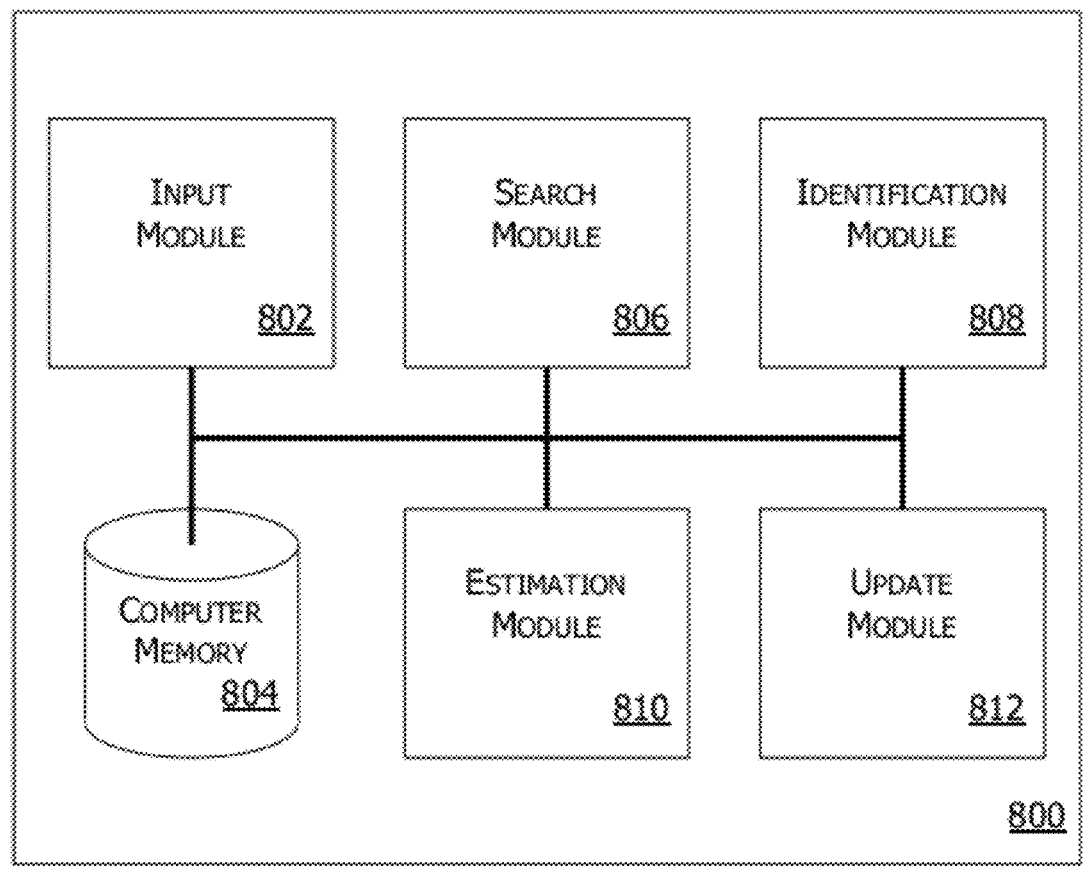
FIG. 8 is a block diagram of another system for estimating an object's attitude in accordance with an embodiment of the invention.

FIG. 8 illustrates a system 800 for estimating an object's attitude. The system 800 may be known as a "lost-in-space" device because it can determine the attitude independent from any initialization data. Compressed-sample data, generated using any of the above-identified techniques, is received by an input module 802 and may be stored in computer memory 804 (which may be rad-hard computer memory). A search module 806 determines, from the compressed-sample data and in the compressed domain, the positions of stars in the starfield image described by the compressed samples. An identification module 808 identifies the stars based at least in part on their determined positions, and an estimation module 810 determines, in the compressed domain, the attitude of an object viewing the starfield. An update module 814 may update star locations and/or identities based on later-determined data.

Figure 9:
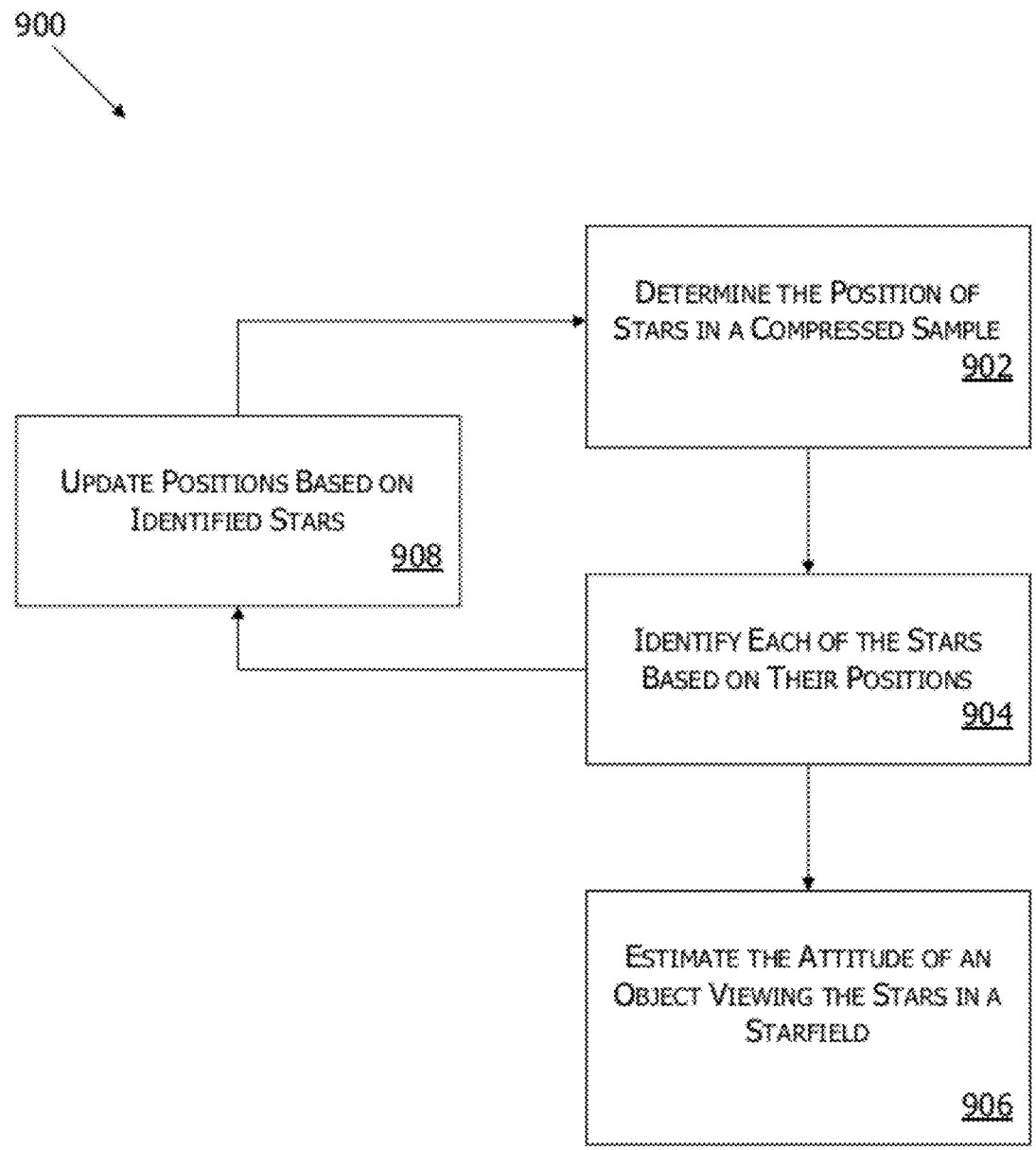
FIG. 9 is another flowchart for estimating an attitude of an object in accordance with an embodiment of the invention.

FIG. 9 illustrates a flowchart 900 for estimating an attitude of an object. The positions of a plurality of stars in a compressed sample representing a starfield view as seen from an object are determined in a compressed domain (Step 902). Each of the plurality of stars is identified based at least in part on their determined positions (Step 904). An attitude of the object is estimated, in the compressed domain, based at least in part on the identified stars (Step 906). The positions of the stars may be updated with new information obtained by determining the identities of the stars (Step 908).

Referring to Step 902 in greater detail, the search module 806 analyzes compressed-sample data to determine the location of stars in the starfield. The search module 806 may compare the average intensity of stars in the compressed-sample data to a given threshold (for example, for an intensity range of 0 to 255, to a mid-point threshold of 127), and each point that is greater than the threshold is deemed a star. In another embodiment, the search module 806 compares values in the compressed-sample data relative to other values and deems any value greater than a baseline (for example, an intensity twice as large as a background intensity) to be a star.

In Step 904, the identities of the stars (i.e., their assigned names or designations) are determined based on their relative positions. In general, the identification module 808 forms constellations (e.g., patterns) of the stars found in the starfield data and matches the constellations to known constellations. In one embodiment, the original starfield is partially or fully derived (i.e., de-compressed) from the compressed data and the constellations are found by directly analyzing the de-compressed image. Once the constellations are determined, the stars forming the known constellations may be identified.

Figure 10:
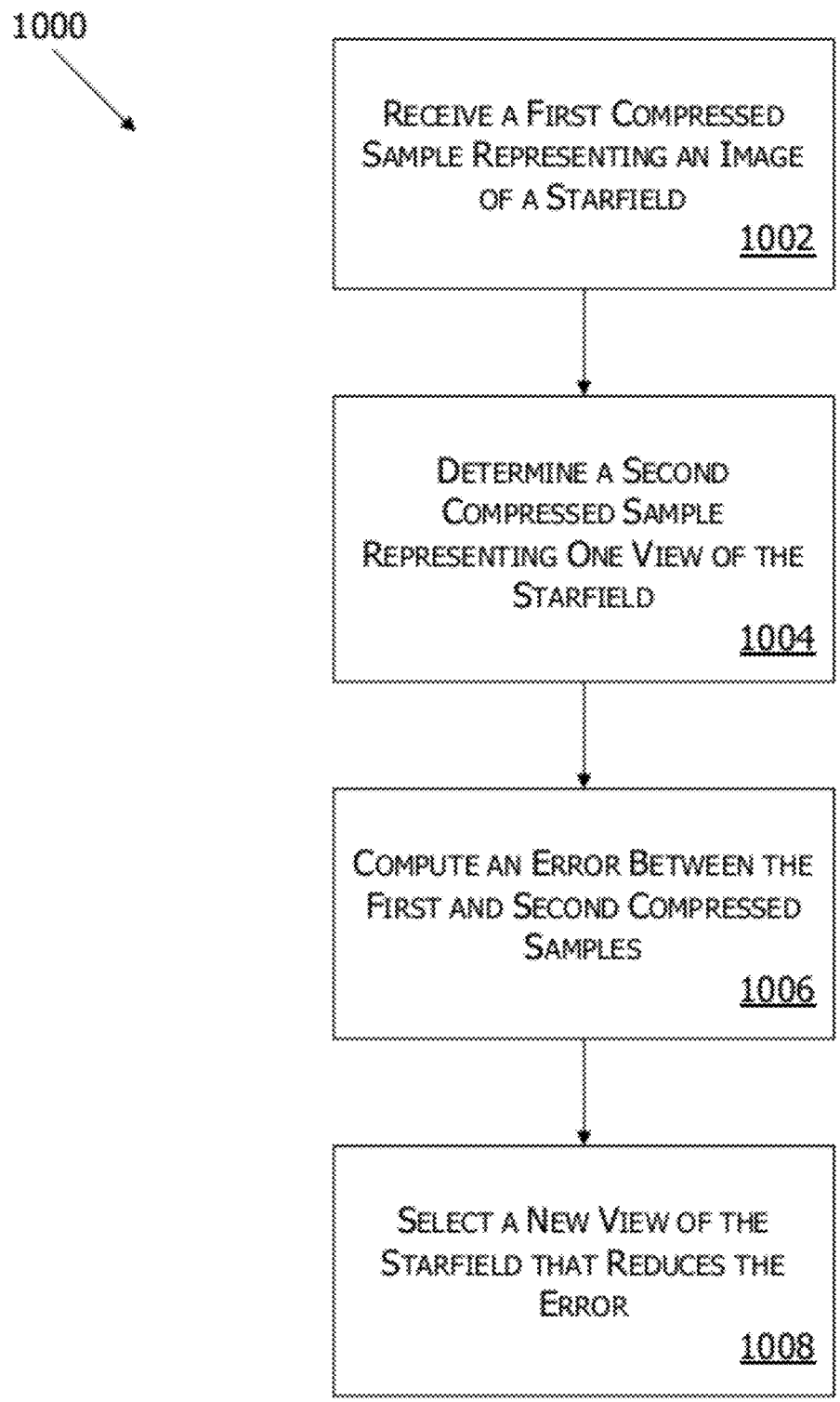
FIG. 10 is a flowchart for estimating an attitude of an object in accordance with an embodiment of the invention.

FIG. 10 illustrates a flowchart 1000 for estimating an attitude of an object exclusively in compressed space. In this embodiment, the original starfield image is not de-compressed and the constellation-identification procedure uses only compressed data. That is, a database stores all possible compressed images to within a certain angular resolution, and comparisons are carried out directly in the compressed space via an efficient nearest-neighbor-search data structure (e.g., KD tree). For example, in a first step 1002, a first compressed sample representing an image of a starfield is received. The first compressed sample may be created by, for example, a compression module 210 or directly by an image source 202. A second compressed sample that represents one of a plurality of known views of the starfield is determined (Step 1004). For example, a view may be selected from database of possible views, and the compressed sample generated therefrom. In another embodiment, the database stores the compressed samples of the views, not the views themselves, and the second compressed sample may be selected directly from the database. The error (i.e., discrepancy or difference) between the first and second samples is computed (Step 1006) and a new view of the starfield is selected that reduces the error (Step 1008). Steps 1006 and 1008 may comprise a least-squares-fit algorithm.

In one embodiment, the identification module 808 analyzes the three brightest stars found in the starfield image and forms a triangle (i.e., a simple constellation) of the three stars. Based on properties of the triangle (e.g., the length of each side and the angles between adjacent sides), the identification module 808 searches through a database that includes the three brightest stars present in any possible field of view visible by the object and matches the generated triangle to information in the database. In other embodiments, other stars in the starfield image may be identified. If, for example, four stars are found, one or more of the triangles created by selecting three of the four stars may be analyzed.

The identification module 808 may match the stars in the starfield to within an acceptable margin of error (e.g., 90% certainty) and output a rough attitude estimate based on star identification to the attitude estimation module 810. In Step 906, the attitude estimation module 810 determines the attitude, in the compressed domain, of the object by analyzing the positions and identities of the stars found in the starfield. In one embodiment, the entire star image, not just the subset of stars, is used for the star identification. This matching may be carried out using the compressed samples. A least-squares fit may be used over the set of attitude parameters, subject to the constraint that the viewed image is consistent with the compressed samples collected up to noise. A minimization algorithm such as a downhill-least-squares-fit algorithm (e.g., a Quest algorithm) may be used to determine the attitude that minimizes error between the observed stars and predicted stars.

The update module 812 may feed back information from the stars identified by the identification module 808 to the search module 806. For example, the identification module 808 may instruct the search module 806 to focus on a few selected stars and to extract only those stars. In another embodiment, the identification module 808 may request that the search module 806 extract more stars. The loop formed by the search module 806, identification module 808, and update module 812 (corresponding to steps 902, 904, and 908 in FIG. 9) may iterate until the identification module 808 successfully identifies three or more stars.

The attitude estimation system 800, in addition to or in place of the systems 200 and 600 described above, may be used in a variety of applications. In one embodiment, the systems may be used in a very low-power (e.g., less than five Watt) star-tracker-based inertial attitude determination system, in a strategic stellar-inertial navigation system, or in any other stellar-inertial attitude determination systems, such as, for example, those used in civilian and military spacecraft.

It should also be noted that embodiments of the present invention may be provided as one or more computer-readable programs embodied on or in one or more articles of manufacture. The article of manufacture may be any suitable hardware apparatus, such as, for example, a floppy disk, a hard disk, a CD ROM, a CD-RW, a CD-R, a DVD ROM, a DVD-RW, a DVD-R, a flash memory card, a PROM, a RAM, a ROM, or a magnetic tape. In general, the computer-readable programs may be implemented in any programming language. Some examples of languages that may be used include C, C++, or JAVA. The software programs may be further translated into machine language or virtual machine instructions and stored in a program file in that form. The program file may then be stored on or in one or more of the articles of manufacture.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and the scope of the invention. As such, the invention is not to be defined only by the preceding illustrative description.

What is claimed is:

1. A method for estimating an attitude of an object, the method comprising:
    (a) receiving, from an image source, a first series of starfield images;
    (b) upon determining that the first series of starfield images is of sufficient quality for compressive sampling, requesting that the image source send starfield images of lesser quality;
    (c) receiving, from the image source, a second series of starfield images;
    (d) upon determining that the second series of starfield images is of insufficient quality for compressive sampling, requesting that the image source send starfield images of greater quality;
    (e) determining, in a compressed domain, the positions of a plurality of stars in a compressed sample representing a starfield view as seen from an object;
    (f) identifying, in the compressed domain, each of the plurality of stars based at least in part on their determined positions;
    (g) updating at least one of the determined positions based on one or more of the identified stars;
    (h) repeating steps (e)-(g) until a pattern comprising at least three identified stars has been recognized; and
    (i) estimating, in the compressed domain, an attitude of the object based at least in part on the pattern of identified stars.

2. The method of claim 1, further comprising storing the estimated attitude in computer memory.

3. The method of claim 2, wherein the computer memory is rad-hard computer memory.

4. The method of claim 1, wherein the identifying step comprises looking up, in a database, a shape of a triangle formed by the three brightest stars in the starfield view.

5. The method of claim 1, wherein the identifying step comprises applying a star-identification algorithm.

6. The method of claim 1, wherein the estimating step comprises applying, in the compressed domain, a downhill least-squares-fit algorithm to the compressed sample and identified stars.

7. The method of claim 1, wherein the estimating step comprises applying, in the compressed domain, a minimization algorithm to the compressed sample and identified stars.

8. The method of claim 1, wherein the compressed sample comprises an average of a plurality of compressed samples of the starfield view.

9. The method of claim 1, wherein the starfield view comprises a plurality of digital images.

10. The method of claim 1, further comprising updating the identified stars based upon the update in step (g) to the at least one determined position of the star.

11. The method of claim 1, wherein the object is selected from the group consisting of a satellite, a spacecraft, an aircraft, and a ground-based star-viewing object.

12. A computer system for estimating an attitude of an object, the system comprising:
    an input module for:
        (i) receiving, from an image source, a first series of starfield images,
        (ii) upon determining that the first series of starfield images is of sufficient quality for compressive sampling, requesting that the image source send starfield images of lesser quality,
        (iii) receiving, from the image source, a second series of starfield images, and
        (iv) upon determining that the second series of starfield images is of insufficient quality for compressive sampling, requesting that the image source send starfield images of greater quality;
    a search module for determining, in a compressed domain, the positions of a plurality of stars in a compressed sample representing a starfield view as seen from an object;
    an identification module for identifying, in the compressed domain, each of the plurality of stars based at least in part on their determined positions;
    an update module for updating at least one of the determined positions based on one or more of the identified stars, the search, identification, and update modules being configured to repeatedly perform their respective functions until a pattern comprising at least three identified stars has been recognized; and
    an estimation module for estimating, in the compressed domain, an attitude of the object based at least in part on the pattern of identified stars.

13. The system of claim 12, further comprising a computer memory for storing the estimated attitude.

14. The system of claim 13, wherein the computer memory is rad-hard computer memory.

15. The system of claim 12, wherein the identification module, in identifying each of the plurality of stars, looks up, in a database, a shape of a triangle formed by the three brightest stars in the starfield view.

16. The system of claim 12, wherein the estimation module, in estimating the attitude of the object, applies a downhill least-squares-fit algorithm to the compressed sample and identified stars.

17. The system of claim 12, wherein the estimation module, in estimating the attitude of the object, applies a minimization algorithm to the compressed sample and identified stars.

18. The system of claim 12, wherein the compressed sample comprises an average of a plurality of compressed samples of the starfield view.

19. The system of claim 12, wherein the starfield view comprises a plurality of digital images.

20. The system of claim 12, wherein the update module further updates the identified stars based upon the update to the at least one determined position of the star.

21. The system of claim 12, wherein the object is selected from the group consisting of a satellite, a spacecraft, an aircraft, and a ground-based star-viewing object.

* * * * *